(12) United States Patent
Wyse

(10) Patent No.: US 7,477,101 B2
(45) Date of Patent: Jan. 13, 2009

(54) FAST CHARGE CIRCUIT FOR USE IN AMPLIFIERS

(75) Inventor: Russell Wyse, Center Pt., IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 11/788,530

(22) Filed: Apr. 19, 2007

(65) Prior Publication Data
US 2008/0018404 A1    Jan. 24, 2008

Related U.S. Application Data

(60) Provisional application No. 60/832,484, filed on Jul. 21, 2006.

(51) Int. Cl.
H03F 1/14    (2006.01)

(52) U.S. Cl. ......................................................... 330/51

(58) Field of Classification Search ..................... 330/9, 330/11, 51; 381/94.5
See application file for complete search history.

(56) References Cited

U.S. PATENT DOCUMENTS 7,053,704 B2 *   5/2006   Forel et al. ..................... 330/69
7,358,804 B2 *   4/2008   Mottola ......................... 330/51

* cited by examiner

Primary Examiner—Steven J Mottola

(57) ABSTRACT

According to an exemplary embodiment, an amplification module includes a bias circuit coupled to an input of an amplifier, where the bias circuit is configured to charge the input of the amplifier to a final bias voltage. The amplification module further includes a fast charge circuit configured to provide a low impedance path between the bias circuit and the input of the amplifier when a voltage at the input of the amplifier is less than the final bias voltage, thereby reducing an enable time of the amplifier. The fast charge circuit is further configured to open the low impedance path when the voltage at the input of the amplifier is substantially equal to the final bias voltage. The fast charge circuit includes a comparator configured to cause the low impedance path to open when the voltage at the input of the amplifier is substantially equal to a reference voltage.

20 Claims, 2 Drawing Sheets

FAST CHARGE CIRCUIT FOR USE IN AMPLIFIERS

The present application claims the benefit of and priority to a pending provisional patent application entitled "Fast Charge Circuit for Use in Amplifiers," Ser. No. 60/832,484 filed on Jul. 21, 2006. The disclosure in that pending provisional application is hereby incorporated fully by reference into the present application.

BACKGROUND OF THE INVENTION

1. Field of the Invention

The present invention relates to the field of electrical circuits. More particularly, the invention relates to amplifier circuits.

2. Background Art

An amplifier, such as low-noise amplifier (LNA) used in cellular handsets, can be required to meet specific linearity and enable time requirements. The linearity of an amplifier, such as an LNA, is typically determined at a particular frequency and can be characterized as a function of input power. For example, the linearity of an amplifier, such as an LNA, can be specified in terms of input third-order intermodulation intercept point (IIP3) performance at a particular tone spacing frequency, which refers to the spacing, i.e., difference in frequency, between two test tones that are used to determine the value of IIP3. The enable time, i.e., turn-on time, of an amplifier, such as an LNA, corresponds to the amount of time required to achieve a final, i.e., steady-state, bias voltage at the bias input of the amplifier.

In a conventional amplifier, such as an LNA, a tank circuit can be utilized at the output of the bias circuit to provide a low impedance at a particular tone spacing frequency so as to meet a linearity specification for IIP3 at that tone spacing frequency. However, for a low tone spacing frequency, such as 15.0 kHz, a large capacitance is typically required in the tank circuit to provide the low impedance necessary to meet IIP3 requirements, which can undesirably increase the enable time of the amplifier by increasing the RC time constant at the bias input of the amplifier. Thus, it is difficult for a conventional amplifier, such as a conventional LNA, to meet IIP3 specifications at low tone spacing frequencies, such as 15.0 kHz, and also meet a fast enable, i.e., turn-on, time specification.

SUMMARY OF THE INVENTION

A fast charge circuit for use in amplifiers, substantially as shown in and/or described in connection with at least one of the figures, as set forth more completely in the claims.

DETAILED DESCRIPTION OF THE INVENTION

The present invention is directed to a fast charge circuit for use in amplifiers. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
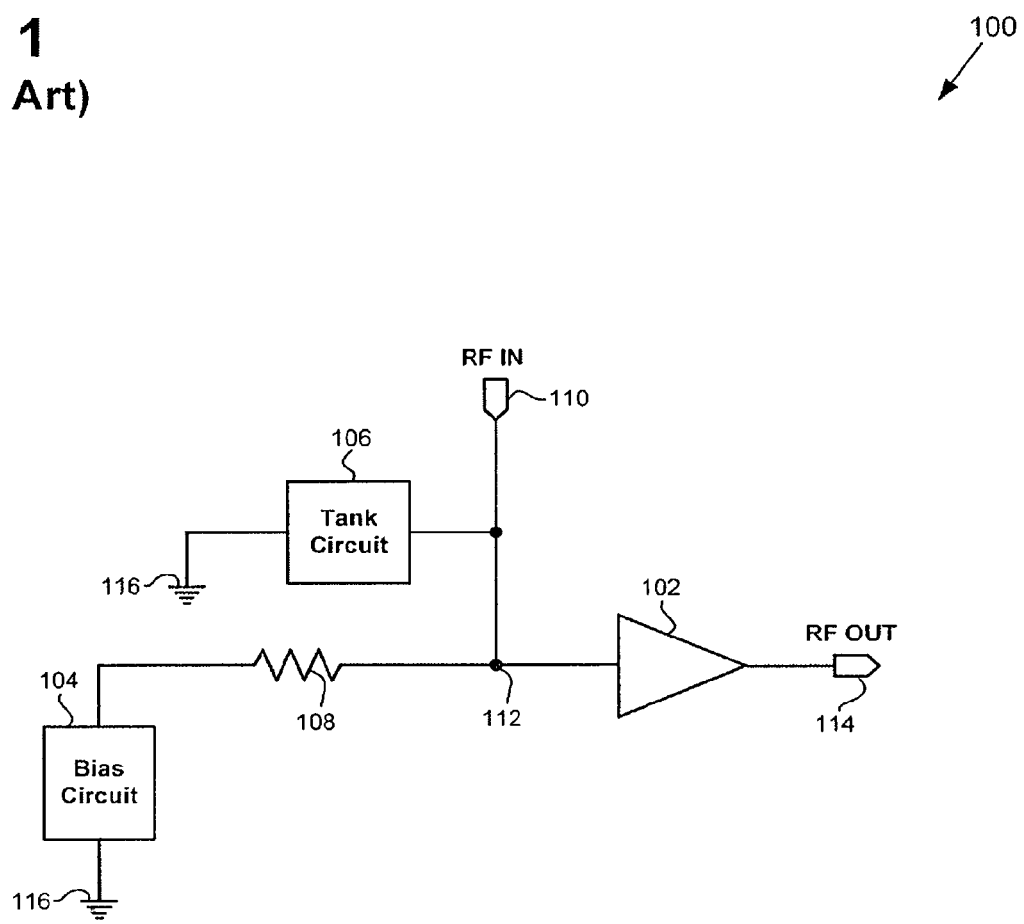
FIG. 1 illustrates a circuit diagram of an exemplary conventional amplification module.

FIG. 1 shows a circuit diagram of an exemplary conventional amplification module. Conventional amplification module 100 includes amplifier 102, bias circuit 104, tank circuit 106, and resistor 108. Conventional amplification module 100 can be used in wireless communication devices, such as cellular handsets, for example. As shown in FIG. 1, RF input signal ("RF IN") 110 is coupled to the input of amplifier 102 at node 112. Amplifier 102 can be configured to receive RF IN 110 and a bias voltage at node 112, amplify RF IN 110, and generate an RF output signal ("RF OUT") 114. Amplifier 102 can be a low-noise amplifier (LNA) or other type of amplifier and can comprise a bipolar transistor.

Further shown in FIG. 1, tank circuit 106 is coupled between ground 116 and node 112. Tank circuit 106 comprises a tuned circuit that includes a capacitor (not shown in FIG. 1), which is coupled between node 112 and ground 116. Tank circuit 106 can be utilized in conventional amplification module 100 to improve or increase the linearity of amplifier 102 (e.g. a LNA). The linearity of an amplifier, such as an LNA, is typically determined at a particular frequency, and may be characterized as a function of input power. For example, an input third-order intermodulation intercept point (IIP3), which can be obtained for the amplifier at a particular frequency, may be used to indicate the linearity of the amplifier at that frequency. A higher value of IIP3 indicates that the linearity of the amplifier extends to a higher input power, and thus is more desirable than a lower value of IIP3. Thus, increased IIP3 performance (i.e. a higher value of IIP3) of the amplifier can indicate an increase in the linearity of the amplifier.

IIP3 can be measured using a two-tone method, where two equal amplitude sinusoidal signals having frequencies $f_1$ and $f_2$ are injecting into an amplifier input. IIP3, which is proportional to the difference in amplitude between one of the two equal amplitude test tones present at the amplifier output and the level of the highest 3rd-order distortion product (i.e. $2f_2 - f_1$ or $2f_1 - f_2$), can then be determined in a manner known in the art. The linearity of the amplifier (e.g. amplifier 102) can be specified in terms of IIP3 performance at a particular tone spacing, which refers to the spacing (difference in frequency) between test tones $f_1$ and $f_2$ that are used to determine the value of IIP3. By configuring tank circuit 106 to provide a low impedance at particular tone spacing frequency, IIP3 performance can be sufficiently increased so as to meet the linearity specification for IIP3 at that tone spacing frequency. However, as the tone spacing frequency is decreased, the capacitance provided by tank circuit 106 at node 112 needs to correspondingly increase for tank circuit 106 to provide a sufficiently low impedance so as to meet the IIP3 specification. For example, a capacitor having a substantially larger capacitance is required in tank circuit 106 to provide a sufficiently low impedance to meet the linearity specification (i.e. the IIP3 requirement) at a tone spacing frequency of 15.0 kHz compared to the capacitance required to meet the linearity specification at a tone spacing frequency of 1.0 MHz.

Also shown in FIG. 1, bias circuit 104 is coupled between ground 116 and a first terminal of resistor 108 and a second terminal of resistor 108 is coupled to node 112. Bias circuit 104 can provide a bias signal, such as a bias voltage, to the input of amplifier 102 at node 112 to enable (i.e. turn on) amplifier 102. Resistor 108 typically has a high resistance to scale the biasing for amplifier 102 and to protect (i.e. sufficiently isolate) bias circuit 104 from the RF input signal (i.e. RF IN 110) at node 112.

Thus, as discussed above, it is necessary for tank circuit 106 to include a capacitor having a sufficiently large capacitance to meet the linearity specification (i.e. IIP3 requirement) at low tone spacing frequencies, such as 15.0 kHz. Also, it is necessary for resistor 108 to have a sufficiently high resistance to scale the biasing for amplifier 102 and to provide RF protection for bias circuit 104. When bias circuit 104 is turned on to enable amplifier 102, the RC time constant formed by the product of the resistance of resistor 108 and the capacitance of tank circuit 112 determines how much time is required for the bias voltage at node 112 to reach a final desired level. As a result of sufficiently increasing the capacitance of tank circuit 106 to meet the linearity specification at low tone spacing frequencies, such as 15.0 kHz, and providing a resistor (i.e. resistor 108) with a sufficiently high resistance to scale the biasing for amplifier 102 and to provide adequate RF protection for bias circuit 104, the RC time constant formed by the product of the resistance of resistor 108 and the capacitance of tank circuit 112 is undesirably high. As a result, the charge time of the capacitor (not shown in FIG. 1) in tank circuit 112 is too long to meet a fast turn-on (i.e. enable) time requirement for amplifier 102.

Figure 2:
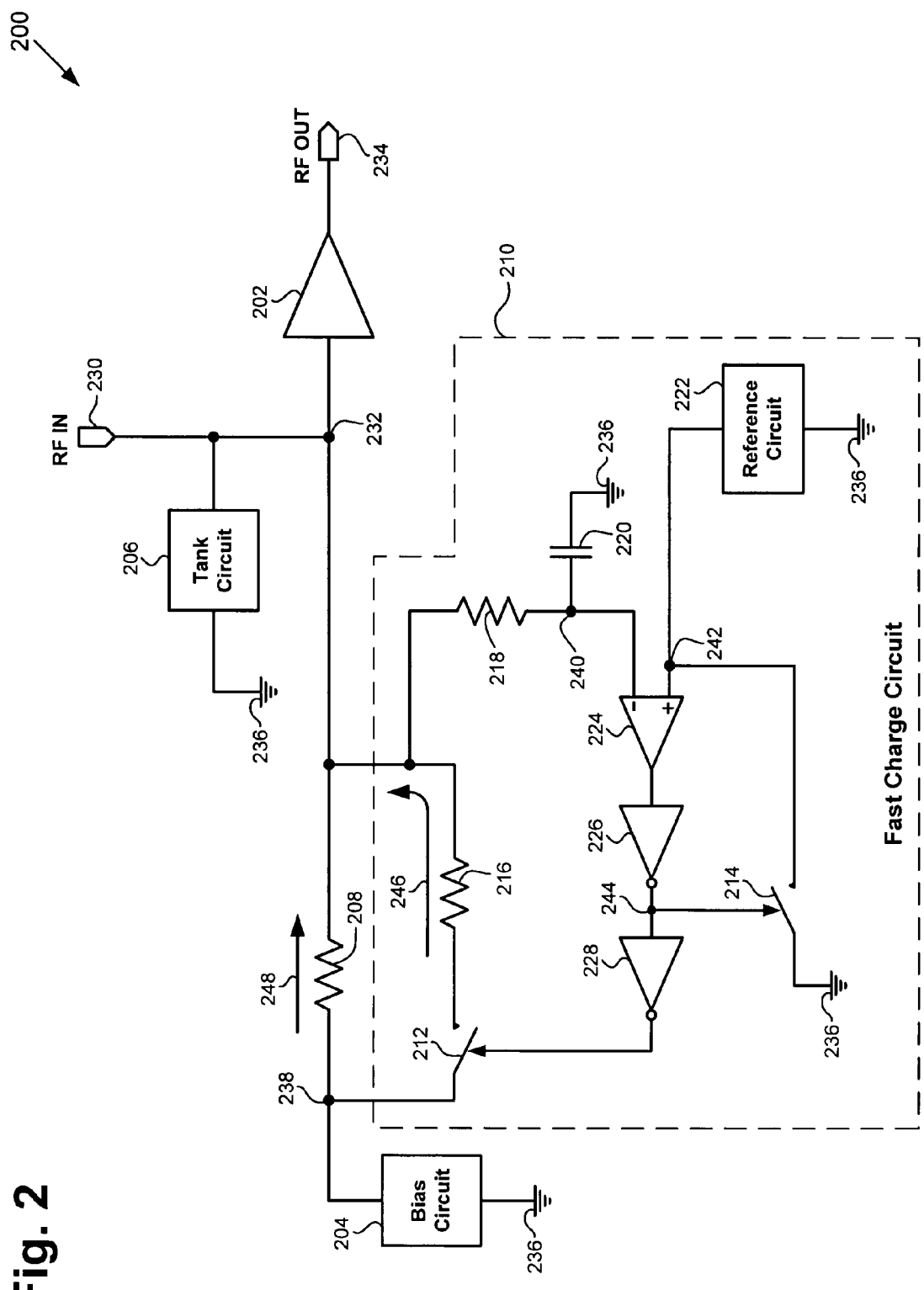
FIG. 2 illustrates a circuit diagram of an exemplary amplification module including an exemplary fast charge circuit in accordance with one embodiment of the present invention.

FIG. 2 shows a circuit diagram of an exemplary amplification module in accordance with one embodiment of the present invention. Certain details and features have been left out of FIG. 2, which are apparent to a person of ordinary skill in the art. Amplification module 200 includes amplifier 202, bias circuit 204, tank circuit 206, resistor 208, and fast charge circuit 210. Fast charge circuit 210 includes switches 212 and 214, resistors 216 and 218, capacitor 220, reference circuit 222, comparator 224, and inverters 226 and 228. Amplification module 200 can be used in wireless communication devices, such as cellular handsets, for example.

As shown in FIG. 2, RF input signal ("RF IN") 230 is coupled to the input of amplifier 202 at node 232. Amplifier 202 can be configured to receive RF IN 230 and a bias signal, such as a bias voltage, at node 232, amplify RF IN 230, and generate an RF output signal ("RF OUT") 234. Amplifier 202 can be a LNA or other type of amplifier having a linearity specification and a turn-on time specification and can comprise a bipolar transistor (not shown in FIG. 2). Further shown in FIG. 2, tank circuit 206 is coupled between ground 236 and node 232. Tank circuit 206 comprises a tuned circuit that includes a capacitor (not shown in FIG. 2), which is coupled between node 232 and ground 236. In amplification module 200, tank circuit 206 can be utilized to improve or increase the linearity of amplifier 202 (e.g. a LNA). IIP3, as discussed above, which can be determined for an amplifier (e.g. amplifier 202) at a particular frequency, can be used to indicate the linearity of the amplifier at that frequency. As discussed above, a higher value of IIP3 indicates that the linearity of an amplifier extends to a higher input power, and thus is more desirable than a lower value of IIP3. Thus, increased IIP3 performance (i.e. a higher value of IIP3) of amplifier 202 can indicate an increase in linearity of the amplifier.

As discussed above, the linearity of the amplifier (e.g. amplifier 202) can be specified in terms of IIP3 performance at a particular tone spacing, which refers to the spacing (difference in frequency) between test tones that are used to determine the value of IIP3. By configuring tank circuit 206 to provide a low impedance at a particular tone spacing frequency, IIP3 performance can be sufficiently increased so as to meet the linearity specification for IIP3 at that tone spacing frequency. To meet the linearity specification (i.e. the IIP3 requirement) at low tone spacing frequencies, such as 15.0 kHz, tank circuit 206 includes a capacitor (not shown in FIG. 2) having a sufficiently large capacitance such that tank circuit 206 can provide a low impedance at the low tone spacing frequencies.

Also shown in FIG. 2, bias circuit 204 can be coupled between ground 236 and node 238. Bias circuit 204 can be configured to output a bias signal, such as a bias voltage, when it (i.e. bias circuit 204) starts up. The bias voltage provided by bias circuit 204 can be applied at node 232 to turn on (i.e. enable) amplifier 202. Node 232 can be coupled to a base of a bipolar transistor (not shown in FIG. 2) that provides RF signal amplification in amplifier 202. Further shown in FIG. 2, a first terminal of resistor 208 is coupled to node 238 and a second terminal of resistor 208 is coupled to node 232. Resistor 208, which is also referred to as a "high resistance resistor" in the present application, is utilized to scale the biasing for amplifier 202 and to provide RF isolation for bias circuit 204. Resistor 208 can have a high resistance of between 200.0 ohms and 2.0 kilo-ohms, for example, to provide a desirably small amount of current in bias circuit 204.

Further shown in FIG. 2, fast charge circuit 210 is coupled between node 238 and node 232 (i.e. across resistor 208). Fast charge circuit 210 can be configured to provide a low impedance path to node 232 for bias circuit 204 when bias circuit 204 is turned on and to disconnect the low impedance path once a final bias voltage level (i.e. a steady state voltage level) is reached at node 232, which provides a bias voltage input for amplifier 202. Also shown in FIG. 2, a first terminal of switch 212 is coupled to node 238, a second terminal of switch 212 is coupled to a first terminal of resistor 216, and a third terminal (i.e. a control terminal) of switch 212 is coupled to the output of inverter 228. In the present embodiment, switch 212 can be a CMOS switch. In other embodiments, switch 212 can comprise a FET or other type of semiconductor device that is configured to operate as a switch. In the present embodiment, switch 212 can be configured to be in a closed position when a logic high level is applied to its control terminal (i.e. third terminal) by inverter 228 and to be in an open position when a digital low level is applied to its control terminal by inverter 228. In the present embodiment, the logic high level can be a voltage level greater than approximately 1.0 volt and the logic low level can be a ground voltage level, which can be approximately 0.0 volts.

Further shown in FIG. 2, a second terminal of resistor 216 is coupled to a first terminal of resistor 218 at node 232. Resistor 216, which is also referred to as a "low resistance resistor" in the present application, has a resistance that is substantially less than the resistance of resistor 208. Resistor 216 can be selected to have a resistance that is sufficiently lower than the resistance of resistor 208 so as to enable the amplifier 202 to meet a fast enable time specification when switch 212 is in the closed position. Also shown in FIG. 2, a second terminal of resistor 218 is coupled to a first terminal of capacitor 220 and the negative input of comparator 224 at node 240, and a second terminal of capacitor 220 is coupled to ground 236. Resistor 218 and capacitor 220 form an RF filter to protect comparator 224 from RF noise. Further shown in FIG. 2, reference circuit 222 is coupled between the positive input of comparator 224 at node 242 and ground 236. Reference circuit 222 provides a reference voltage that is substantially equal to the bias voltage that is outputted by bias circuit 204. In the present embodiment, reference circuit 222 and bias circuit 204 comprise substantially the same circuit. Reference circuit 222 and bias circuit 204 can be selected such that they each output substantially the same voltage. Thus, the final bias voltage (i.e. steady state voltage) at node 232 is substantially equal to the reference voltage provided by reference circuit 222.

Comparator 224 can comprise an operational amplifier and can be configured to output a digital high level when the voltage at the positive input is greater than the voltage at the negative input and to output a digital low level when the voltage at the negative input is equal to or greater than the voltage at the positive terminal. Also shown in FIG. 2, the output of comparator 224 is coupled to the input of inverter 226, the output of inverter 226 is coupled to the input of inverter 228 at node 244, and the output of inverter 228 is coupled to the third terminal (i.e. the control terminal) of switch 212. Inverters 226 and 228 operate in a manner known in the art. Further shown in FIG. 2, a first terminal of switch 214 is coupled to ground 236, a second terminal of switch 214 is coupled to node 242, and a third terminal (i.e. a control terminal) of switch 214 is coupled to the output of inverter 226 and the input of inverter 228 at node 244. In the present embodiment, switch 214 can be a CMOS switch. In other embodiments, switch 214 can comprise a FET or other type of semiconductor device that is configured to operate as a switch. In the present embodiment, switch 214 can be configured to be in a closed position when a logic high level is applied to its control terminal (i.e. third terminal) by inverter 226 and to be in an open position when a digital low level is applied to its control terminal by inverter 226.

The operation of amplification module 200 will now be discussed. When bias circuit 204 is turned on, reference circuit 222 is turned on at substantially the same time. Due to the charging effect caused by the capacitance of tank circuit 206, the voltage on the negative input of comparator 224, which is coupled to node 232, will be less than the voltage on the positive input of comparator 224, which is coupled to reference circuit 222. As a result, comparator 224 will output a high level, which causes inverter 226 to output a low level. The low level outputted by inverter 226 causes switch 214 to be open. The output of inverter 228 is a high level, which causes switch 212 to close. As a result, fast charge circuit 210 provides low impedance path 246 through resistor 216 for bias circuit 204 to charge tank circuit 206 (i.e. the capacitor (not shown in FIG. 2) in tank circuit 206) at node 232. The charging at node 232 continues until node 232 reaches a final bias voltage (i.e. a steady state value), which causes the voltage at the negative input of comparator 224 to be substantially equal to the voltage at the positive input of comparator 224, since the final bias voltage at node 232 is substantially equal to the reference voltage outputted by reference circuit 222.

As a result, the output of comparator 224 switches to a low level, which causes inverter 226 to output a high level so as to cause switch 214 to close and couple ground 236 to the positive input of comparator 224. The hysterysis circuit formed by switch 214 in the closed position so to couple ground 236 to the positive input of comparator 224 causes the output of comparator 224 to remain at a low level. The resulting high level at the output of inverter 226 causes inverter 228 to output a low level so as to cause switch 212 to open. When switch 212 opens, low impedance path 246 is opened, which causes bias circuit 204 to be coupled to node 232 by high impedance path 248 (i.e. through resistor 208), which is also referred to as an "alternate high impedance path" in the present application). The hysterysis circuit causes and ensures that low impedance path 246 remains open by coupling the positive input of comparator 224 to ground 236.

Thus, low impedance path 246 causes node 232 to reach its final steady state value in a significantly faster time than high impedance path 248, since the substantially lower resistance of resistor 216 compared to the resistance of resistor 208 significantly reduces the RC time constant at node 232. As a result, low impedance path 246, which can be controlled by appropriately selecting resistor 216, causes amplifier 202 to meet a fast enable (i.e. turn-on) specification. Also, by switching out (i.e. opening) low impedance path 246 when a final bias voltage level is reached at node 232, the invention provides a high impedance path between bias circuit 204 and node 232, which provides RF isolation for bias circuit 204 and a low bias current.

Thus, by providing a low impedance path for biasing an amplifier, such as a LNA, the invention's fast charge circuit advantageously reduces the enable time of the amplifier so as to cause the amplifier to meet a fast turn-on specification. Also, by switching out the low impedance bias path after a steady state bias voltage has been achieved, the invention's fast charge circuit causes a high impedance bias path to provide RF isolation for the bias circuit. Additionally, the invention's fast charge circuit allows a tank circuit having a sufficiently large capacitance to be coupled to the bias node to cause the amplifier to meet a linearity specification (i.e. IIP3 requirement) at low tone spacing frequencies, such as a tone spacing frequency of 15.0 kHz. Furthermore, by providing a faster turn-on time for an amplifier, the invention's fast charge circuit advantageously reduces current consumption by causing the amplifier to turn on quicker.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a fast charge circuit for use in amplifiers has been described.

The invention claimed is:

1. An amplification module comprising:
  a bias circuit coupled to an input of an amplifier, said bias circuit configured to charge said input to a final bias voltage;
  a fast charge circuit configured to provide a low impedance path between said bias circuit and said input when a voltage at said input is less than said final bias voltage, thereby reducing an enable time of said amplifier.

2. The amplification module of claim 1, wherein said fast charge circuit is further configured to open said low impedance path when said voltage at said input is substantially equal to said final bias voltage.

3. The amplification module of claim 2, wherein said bias circuit is coupled to said input through an alternate high impedance path when said fast charge circuit opens said low impedance path.

4. The amplification module of claim 1, wherein said fast charge circuit comprises a comparator configured to compare said voltage at said input of said amplifier to a reference voltage and to cause said low impedance path to open when said voltage at said input of said amplifier is substantially equal to said reference voltage.

5. The amplification module of claim 4, wherein said fast charge circuit further comprises a hysterysis circuit, wherein said hysterysis circuit causes a positive input of said comparator to be coupled to ground when said comparator causes said low impedance path to open, thereby causing said low impedance path to remain open.

6. The amplification module of claim 1 further comprising a tank circuit coupled to said input of said amplifier.

7. The amplification module of claim 6, wherein said fast charge circuit causes said tank circuit to have a sufficiently large capacitance so as to cause said amplifier to meet an input third-order intermodulation intercept point (IIP3) specification at a tone spacing frequency of 15.0 kHz.

8. The amplification module of claim 4, wherein said reference voltage is substantially equal to said final bias voltage.

9. The amplification module of claim 3, wherein an RF input signal is coupled to said input of said amplifier, wherein said alternate high impedance path provides RF isolation for said bias circuit.

10. The amplification module of claim 1, wherein said amplifier is a low-noise amplifier (LNA).

11. A fast charge circuit for reducing an enable time of an amplifier, said amplifier having an input coupled to a bias circuit, said fast charge circuit comprising:
a comparator configured to compare a voltage at said input of said amplifier with a reference voltage and to cause said bias circuit to be coupled to said input of said amplifier by a low impedance path if said voltage is less than said reference voltage, thereby reducing said enable time of said amplifier.

12. The fast charge circuit of claim 11, wherein said reference voltage is substantially equal to a final bias voltage at said input of said amplifier.

13. The fast charge circuit of claim 11, wherein said comparator is further configured to cause said bias circuit to be coupled to said input of said amplifier by an alternate high impedance path if said voltage at said input of said amplifier is substantially equal to said reference voltage.

14. The fast charge circuit of claim 11 further comprising a switch coupled in series with said low impedance path, wherein said comparator causes said switch to close to cause said bias circuit to be coupled to said input of said amplifier by said low impedance path.

15. The fast charge circuit of claim 11 further comprising a hysterysis circuit, wherein said hysterysis circuit causes a positive input of said comparator to be coupled to ground when said comparator causes said bias circuit to be coupled to said input of said amplifier by said low impedance path.

16. The fast charge circuit of claim 11, wherein said input of said amplifier is coupled to a negative input of said comparator and said reference voltage is coupled to a positive input of said comparator.

17. The fast charge circuit of claim 13, wherein said low impedance path comprises a low resistance resistor and said alternate high impedance path comprises a high resistance resistor, wherein said low resistance resistor is coupled in parallel with said high resistance resistor when said bias circuit is coupled to said input of said amplifier by said low impedance circuit.

18. The fast charge circuit of claim 11, wherein a capacitance of a tank circuit coupled to said input of said amplifier causes said voltage at said input of said amplifier to increase to a final bias voltage, wherein said final bias voltage is substantially equal to said reference voltage.

19. The fast charge circuit of claim 13, wherein an RF input signal is coupled to said input of said amplifier, wherein said alternate high impedance path provides RF isolation for said bias circuit.

20. The fast charge circuit of claim 11, wherein said amplifier is a low-noise amplifier (LNA).

* * * * *